United States Patent
White (10) Patent No.: US 10,050,618 B1
(45) Date of Patent: Aug. 14, 2018

(54) RESET MANAGEMENT CIRCUIT AND METHOD THEREFOR

(71) Applicant: NXP USA, INC., Austin, TX (US)

(72) Inventor: Adam Jerome White, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/486,453

(22) Filed: Apr. 13, 2017

(51) Int. Cl.
*H03L 7/00* (2006.01)
*H03K 17/22* (2006.01)
*H03K 3/037* (2006.01)
*H03K 19/20* (2006.01)

(52) U.S. Cl.
CPC .............. *H03K 17/22* (2013.01); *H03K 3/037* (2013.01); *H03K 19/20* (2013.01)

(58) Field of Classification Search
CPC ...................................................... H03K 17/22
See application file for complete search history.

(56) References Cited

U.S. PATENT DOCUMENTS

| | | | |
|---|---|---|---|
| 5,309,037 A | 5/1994 | Curley et al. | |
| 6,456,135 B1 | 9/2002 | Albean | |
| 7,525,353 B2 | 4/2009 | Wadhwa et al. | |
| 9,494,969 B2 | 11/2016 | Gupta et al. | |
| 2009/0079476 A1 | 3/2009 | Sakai et al. | |
| 2009/0240460 A1* | 9/2009 | Hur | G01R 31/31701 702/120 |
| 2009/0323442 A1 | 12/2009 | Song | |
| 2012/0242380 A1 | 9/2012 | Edwards | |
| 2014/0132293 A1 | 5/2014 | Abadir et al. | |

* cited by examiner

*Primary Examiner* — Daniel Puentes (57) ABSTRACT

A signal management circuit includes a first input terminal to receive a first signal. A first logic portion is coupled to the first input terminal and configured to provide a first output signal. A second logic portion is coupled to receive a second signal and configured to provide a second output signal. The second signal is based on the first output signal and the first signal. An output terminal is coupled to provide a third output signal based on the first output signal and the second output signal.

19 Claims, 4 Drawing Sheets

RESET MANAGEMENT CIRCUIT AND METHOD THEREFOR

BACKGROUND

Field

This disclosure relates generally to integrated circuits, and more specifically, to circuits and methods for managing reset in an integrated circuit.

Related Art

Today many integrated circuits utilize test techniques to improve test coverage of complex digital circuitry. With the increased complexity of digital design, reset architecture has also become very complex. For example, in a modern system-on-chip (SoC) device, a system reset generally resets most of the SoC. The system reset may include multiple reset sources which can be generated either by software or hardware. Reset sources such as power-on reset (POR), low voltage detected (LVD) reset, watchdog timeout reset, debug reset, and the like may cause assertion of a system reset signal. However, reset sources may provide significant challenges when testing complex integrated circuitry.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an integrated circuit that includes reset management circuitry to selectively block or delay an indication of a reset condition during a test operation. For example, a margin test operation typically includes systematically reducing voltage supplied to digital circuitry under test until a failure is detected. The failure may likely occur at a voltage level lower than a predetermined threshold of voltage monitors designed to safeguard operation of such circuitry. A reset condition initiated by reducing the supplied voltage below the predetermined threshold can be safely blocked during the test operation, allowing the test operation to complete without interruption and delaying a reset of the digital circuitry until completion of the test operation.

Figure 1:
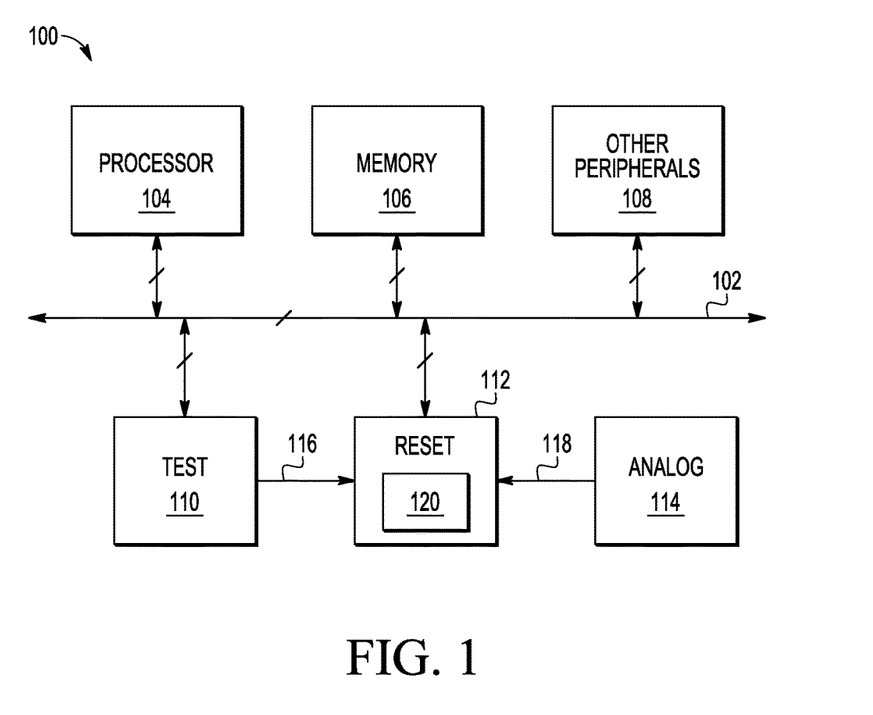
FIG. 1 illustrates, in simplified block diagram form, an exemplary integrated circuit in accordance with an embodiment of the present disclosure.

FIG. 1 illustrates, in simplified block diagram form, exemplary integrated circuit processing system 100 in accordance with an embodiment of the present disclosure. In some embodiments, processing system 100 may be characterized as a system-on-a-chip (SoC). Processing system 100 includes a system bus 102, processor 104, memory 106, other peripherals 108, test controller 110, reset controller 112, and analog circuit block 114. Processor 104, memory 106, other peripherals 108, test controller 110, and reset controller 112 are each bi-directionally coupled to system bus 102 by way of respective communication buses. In some embodiments, analog circuit block 114 may be coupled to system bus 102 by way of a communication bus. In some embodiments, analog circuit block 114 may be formed on a die separate from a die including reset circuit block 112. In other embodiments, processing system 100 may include other blocks, peripherals, and devices and/or be arranged in other configurations.

System bus 102 can be any type of bus for communicating any type of information such as address, data, instructions, clocks, reset, and control. System bus 102 provides a communication backbone for communications among the processor 104, memory 106, other peripherals 108, test circuit block 110, and reset circuit block 112.

Processor 104 may be any type of processor, including circuits for processing, computing, etc., such as a microprocessor (MPU), microcontroller (MCU), digital signal processor (DSP), or other type of processing core. Processing system 100 may include multiple processors like processor 104. Processor 104 is configured to execute instructions in order to carry out one or more designated tasks.

Memory 106 may include any suitable type of memory array, such as static random access memory (SRAM), for example. Memory 106 may also be coupled directly or tightly coupled to processor 104. Processing system 100 may include multiple memories like memory 106 or a combination of different memories. For example, processing system 100 may include a flash memory in addition to memory 106.

Other peripherals 108 of processing system 100 may include any number of other circuits and functional hardware blocks such as accelerators, timers, counters, communications, interfaces, analog-to-digital converters, digital-to-analog converters, PLLs, and the like for example. Other peripherals 108 are each bi-directionally coupled to system bus 102 by way of respective communication buses.

Test controller 110 is a circuit block for controlling testing of one or more peripherals, processors, memories, functional blocks, units, circuits, and the like of processing system 100. Test controller 110 may provide testing control for determining manufacturing defects, operational margins, and the like. Test controller 110 includes one or more outputs for providing control signals to peripherals, functional blocks, units, circuits, and the like. For example, control signal 116 is provided to reset controller 112. Control signal 116 may be characterized as a test signal corresponding to a test mode and used as an enable signal for reset controller 112 circuitry.

Reset controller 112 is a circuit block for controlling one or more reset functions of processing system 100. Reset controller 112 may include circuitry for reset detection from on-chip and/or off-chip sources, and for reset signal distribution to peripherals, functional blocks, units, circuits, and the like of processing system 100. Reset source signals may be routed or communicated by way of system bus 102 and communication buses. Reset source signals may be routed or communicated directly to reset controller 112. For example, a reset source signal labeled 118 from analog circuit block is provided to reset controller 112. Reset controller 112 includes reset management circuit 120 having a first input to receive a reset source signal such as 118, a second input to receive an enable signal such as 116, and an output to provide an output signal. Reset signals may be distributed to peripherals, functional blocks, units, circuits, and the like by way of system bus 102 and communication buses, or may be directly routed to such peripherals, functional blocks, units, circuits, and the like.

Analog circuit block 114 of processing system 100 may include one or more analog circuits to perform any number of functions such as temperature detection, voltage monitoring, and the like. In some embodiments, analog circuit block 114 may include features and functions which communicate by way of system bus 102 and a locally coupled communication bus. In some embodiments, analog circuit block 114 may be formed on a die separate from a die including reset circuit block 112. In this embodiment, analog circuit block 114 includes low voltage detection (LVD) circuitry and provides an output signal labeled 118 to reset controller 112. In some embodiments, the LVD circuitry may be located in other portions of processing system 100.

Figure 2:
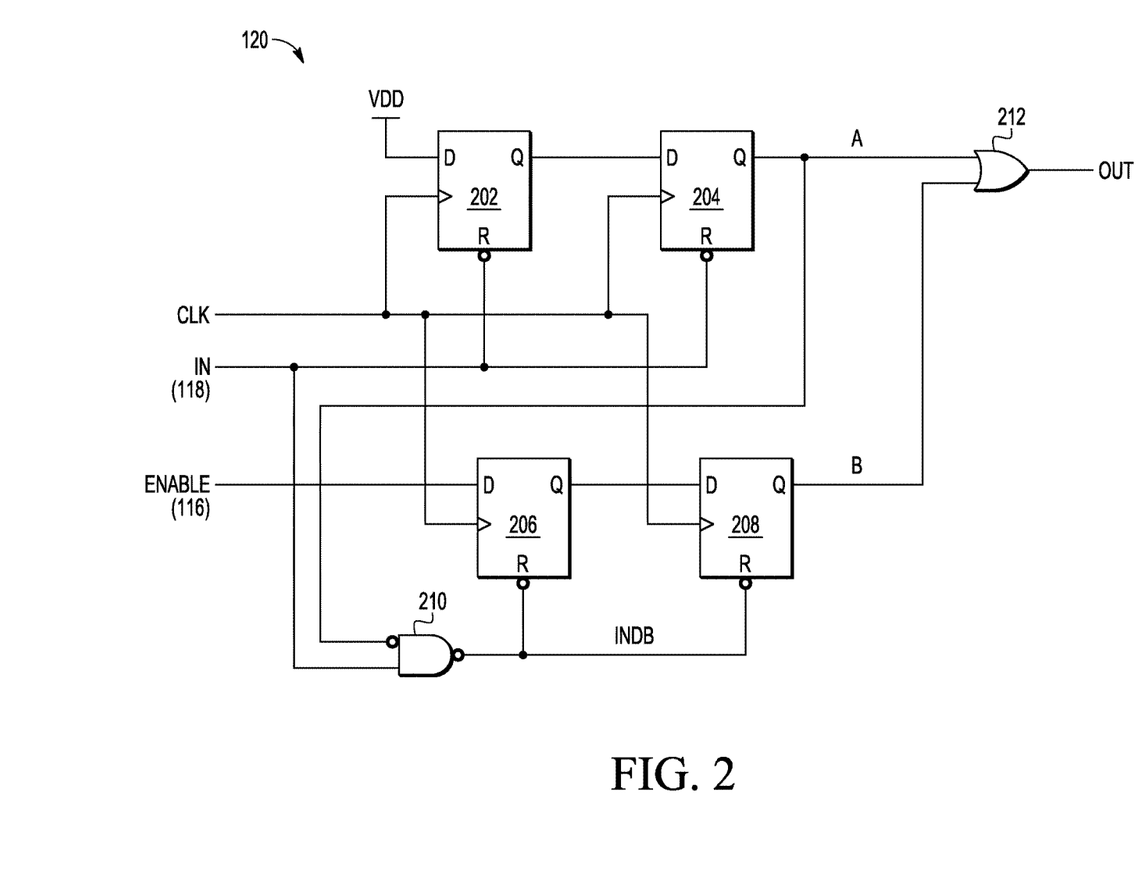
FIG. 2 illustrates, in simplified block diagram form, an exemplary reset management circuit in accordance with an embodiment of the present disclosure.

FIG. 2 illustrates, in simplified block diagram form, an exemplary reset signal management circuit 120 in accordance with an embodiment of the present disclosure. Reset management circuit 120 may be a portion of reset controller 112. Reset management circuit 120 includes input terminals to receive a clock signal labeled CLK, an input signal labeled IN, an enable signal labeled ENABLE, and an output terminal to provide an output signal labeled OUT. Signals IN and ENABLE are received at input terminals IN and ENABLE respectively. In this embodiment, the signal ENABLE (116) corresponds to a test signal during a test mode. The signal ENABLE may be provided by a control register output, combinational logic, or the like located in the test controller 110. In this embodiment, the signal IN (118) corresponds to an indication that a reset condition is active or occurring (e.g., low voltage detection signal). The signal IN may be provided by an output of analog circuitry such as sensor output, voltage detector or monitor output, temperature detector or monitor output, and the like located in analog block 114. In some embodiments, the indication may correspond to other reset conditions generated by other circuits in processing system 100.

In this embodiment, reset management circuit 120 includes flip-flops 202-208, NAND gate 210, and OR gate 212. Flip-flops 202-208 may be characterized as master-slave flip-flops, D-type flip-flops (DFF), or the like. In some embodiments, reset management circuit 120 may include other logic and circuitry configurations.

Each flip-flop 202-208 includes a data input labeled D, a clock input indicated by a chevron-like symbol, a reset input labeled R, and an output labeled Q. Flip-flops 202-208 may include other inputs and outputs. In this embodiment, reset input R of each flip-flop includes a "bubble" illustrated at each flip-flop symbol to indicate that reset input R is an active low input. For example, a logic low signal provided at such reset input R will reset flip-flop causing a logic low signal to be provided at corresponding output Q.

A first logic portion of reset management circuit 120 includes flip-flops 202 and 204. Input D of flip-flop 202 is coupled to receive a logic high signal by way of power supply terminal labeled VDD. In this embodiment, a VDD voltage may be characterized as a nominal operating voltage for digital logic and applied at the VDD power supply terminal. As used herein, the term VDD may be used interchangeably as the VDD voltage and the voltage applied at the VDD power supply terminal. Reset input R of flip-flop 202 is coupled to receive signal IN, and output Q of flip-flop 202 is coupled to input D of flip-flop 204. Reset input R of flip-flop 204 is coupled to receive the signal IN, and output Q of flip-flop 204 is coupled to a first input of OR gate 212 at node labeled A.

A second logic portion of reset management circuit 120 includes flip-flops 206 and 208. Input D of flip-flop 206 is coupled to receive signal ENABLE. Reset input R of flip-flop 206 is coupled to output of NAND gate 210 at node labeled INDB, and output Q of flip-flop 206 is coupled to input D of flip-flop 208. Reset input R of flip-flop 204 is coupled to output of NAND gate 210 at node labeled INDB, and output Q of flip-flop 208 is coupled to a second input of OR gate 212 at node labeled B.

A first input of NAND gate 210 is coupled to output Q of flip-flop 204 at node A. A "bubble" is illustrated at the first input of NAND gate 210 symbol to indicate that the first input is an inverting or negating input. A second input of NAND gate 210 is coupled to receive signal IN. NAND gate 210 is coupled to receive signal IN and signal at node A, and at an output, provides signal at node INDB. OR gate 212 is coupled to receive signals at nodes A and B, and at an output, provides signal OUT.

Figure 3:
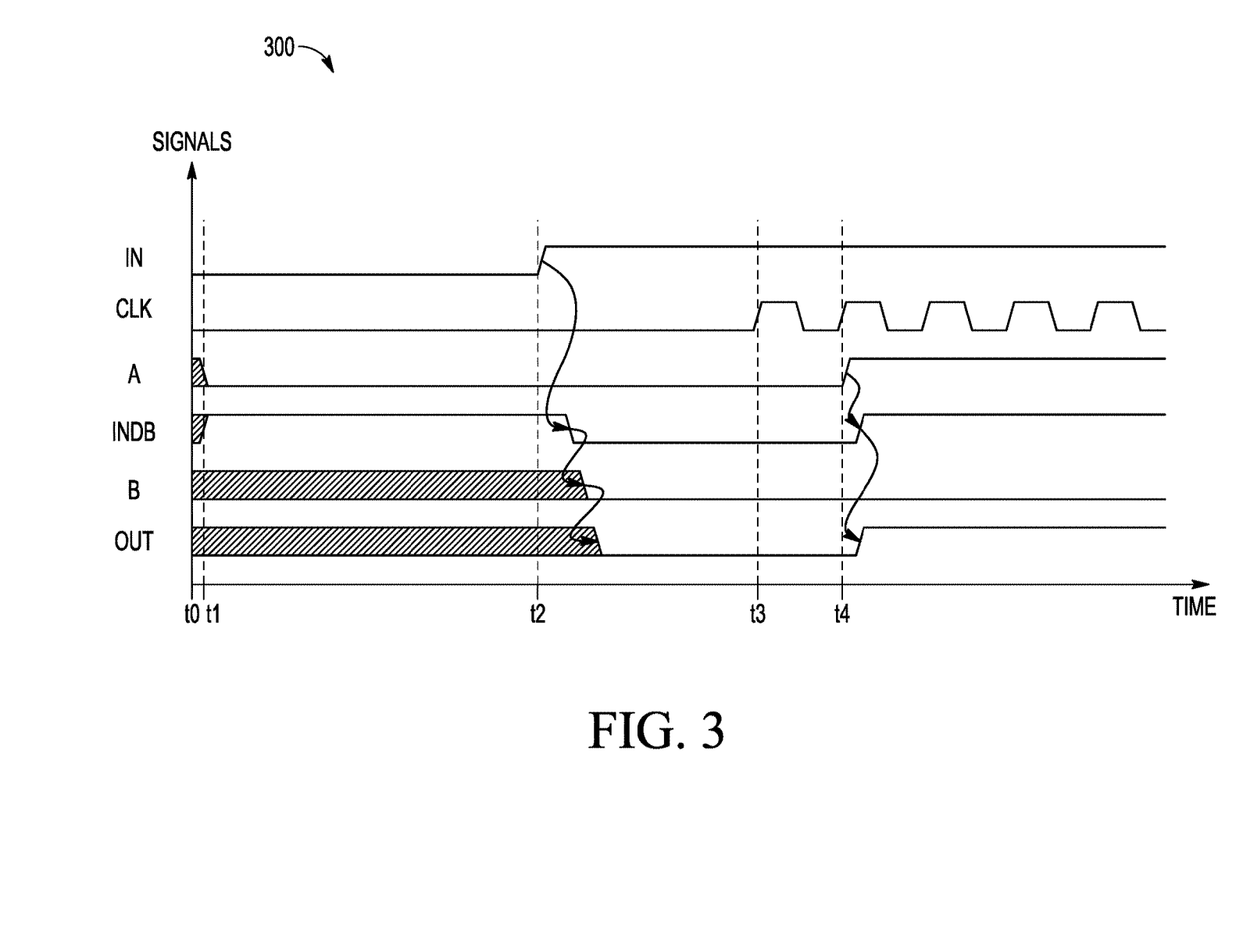
FIG. 3 illustrates, in timing diagram form, exemplary power-up signal timing in accordance with an embodiment of the present disclosure.

FIG. 3 illustrates, in timing diagram form, exemplary power-up signal timing 300 in accordance with an embodiment of the present disclosure. Power-up signal timing 300 includes various signal waveforms versus time for a power-up operation consistent with exemplary reset management circuit 120 illustrated in FIG. 2. In this embodiment, signal IN (e.g., 118 FIG. 1) is provided by low voltage detection circuitry of analog circuit block 114 and signal ENABLE (e.g., 116 FIG. 1) is provided by test controller 110. Signals IN and ENABLE are received at input terminals IN and ENABLE respectively. The signal IN may be characterized as a low voltage indication (LVI) signal, a low voltage detection (LVD) signal, or a brownout signal where a logic low indicates that voltage is detected below a predetermined threshold and logic high indicates that voltage is detected at or above the predetermined threshold. The LVI, LVD, or brownout signal may be desirable to control an orderly reset or wake-up of digital circuitry. By way of example, signal timing for a power-up operation follows.

At time t0, during the power-up operation, voltage applied at the VDD power supply terminal is ramping up and lower than a predetermined threshold. Because the voltage has not yet reached the predetermined threshold, an output signal of low voltage detection circuitry provides low voltage indication as a logic low signal received at the input IN. Signal CLK is at a logic low and signals at nodes A, B, INDB, and OUT are unknown. Signal ENABLE (not shown) is at a logic low for the power-up operation depicted in FIG. 3.

At time t1, a logic low signal received at the input IN causes logic low signals provided at outputs Q of flip-flops 202 and 204. In turn, signal at node A transitions to a logic low. A logic low signal received at the input IN causes output of NAND gate 210 to transition to a logic high signal at node INDB.

At time t2, signal IN transitions to a logic high signal indicating that the voltage applied at the VDD power supply terminal meets or exceeds the predetermined threshold. The output signal of low voltage detection circuitry (signal IN) transitions to a logic high signal which is received at the input IN. Because signal IN transitions to a logic high and signal at node A is a logic low, output of NAND gate 210 transitions to a logic low signal at node INDB. The logic low signal at node INDB causes logic low signals provided at outputs Q of flip-flops 206 and 208. Logic low signals at nodes A and B in turn causes output of OR gate 212 to provide a logic low signal at output OUT. The resulting logic low signal at output OUT, alone or in combination with other signals, can provide indication that a reset condition may be active or occurring.

At time t3, clock signal CLK starts toggling. In this embodiment, a logic high signal output from low voltage detection circuitry indicates that voltage applied at the VDD power supply terminal is at or higher than the predetermined threshold, and sufficient to provide normal operation of digital circuitry. Accordingly, clock circuitry can begin propagation of clock signal CLK.

At time t4, with logic high signal at input IN, signal CLK clocks flip-flops causing the logic high at input D of flip-flop 202 to propagate through output Q of flip-flop 204. A resulting logic high signal at node A causes OR gate 212 output signal to transition to a logic high at output OUT and output signal of NAND gate 210 to transition to a logic high signal at node INDB. The logic high signal at output OUT, alone or in combination with other signals, can provide indication that the reset condition is no longer active or occurring.

Figure 4:
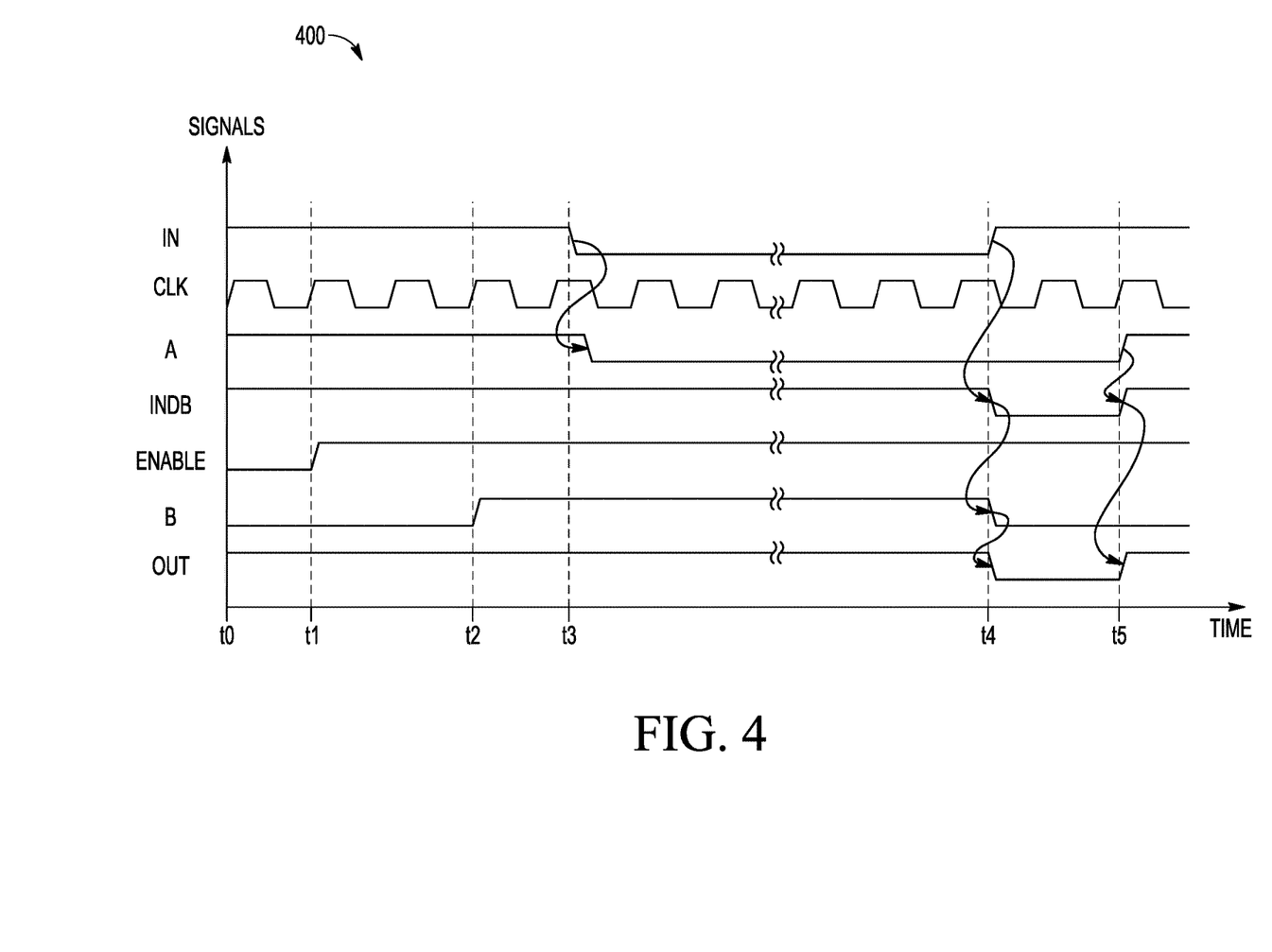
FIG. 4 illustrates, in timing diagram form, exemplary blocking and delay signal timing in accordance with an embodiment of the present disclosure.

FIG. 4 illustrates, in timing diagram form, exemplary blocking and delay signal timing 400 in accordance with an embodiment of the present disclosure. Blocking and delay signal timing 400 includes various signal waveforms versus time for a signal blocking/delay operation consistent with exemplary reset management circuit 120 illustrated in FIG. 2. In this embodiment, signal IN (e.g., 118 FIG. 1) at input IN is provided by low voltage detection circuitry of analog circuit block 114 and signal ENABLE (e.g., 116 FIG. 1) at ENABLE input is provided by test controller 110. The signal IN may be characterized as a low voltage indication (LVI) signal, a low voltage detection (LVD) signal, or a brownout signal where a logic low indicates that voltage is detected below a predetermined threshold and logic high indicates that voltage is detected above the predetermined threshold. The LVI, LVD, or brownout signal may be desirable to control an orderly reset or wake-up of digital circuitry. The signal ENABLE may be characterized as a test signal or a blocking signal which can be enabled during a test mode. The signal ENABLE may also provide indication that a test mode is active. By way of example, signal timing for a reset signal blocking/delay operation follows.

At time t0, a logic high signal is received at the input IN indicating that voltage applied at the VDD power supply terminal is equal to or greater than the predetermined threshold, and sufficient to allow normal operation of digital circuitry. During normal operation, clock signal CLK is toggling, signal at node A is at logic high, resulting signal at node INDB is at logic high, and output signal OUT is at logic high. Signal ENABLE is at logic low and signal at node B is at logic low. The logic high signal at output OUT, alone or in combination with other signals, can provide indication that a reset condition is not active or occurring.

At time t1, signal ENABLE transitions to a logic high. In this embodiment, signal ENABLE may be a test signal from test controller 110 provided for blocking another signal such as a low voltage detection signal during a test mode, for example.

At time t2, logic high signal ENABLE received at input D of flip-flop 206 propagates though output Q of flip-flop 208 as a logic high signal at node B. Output signal OUT remains at logic high.

At time t3, signal IN transitions to logic low. In turn, flip-flops 202 and 204 are reset, and logic low signal results at node A. The logic low signal provided by low voltage detection circuitry of analog circuit block 114 (signal IN) indicates that voltage applied at the VDD power supply terminal is lower than the predetermined threshold.

For example, during a test mode, the voltage applied at the VDD power supply terminal may be systematically lowered such that a minimum operating voltage of digital circuitry under test may be determined. Because the signal ENABLE is asserted as a logic high, the low voltage detection signal at the input IN may be blocked from the output OUT of the reset management circuit 120 so that minimum operating voltage of digital logic can be determined at VDD voltages below the predetermined threshold.

In some embodiments, the signal provided at the input IN may be characterized as a high voltage detection signal provided by voltage detection circuitry of analog circuit block 114. For example, the high voltage detection signal at the input IN may be blocked from the output OUT of the reset management circuit 120 so that maximum operating voltage of digital logic can be determined at VDD voltages above another predetermined threshold. In some embodiments, the signal provided at the input IN may be any other suitable signal which is desirable to block while the ENABLE signal is asserted as a logic high.

At time t4, signal IN transitions to a logic high indicating that the voltage applied at the VDD power supply terminal meets or exceeds the predetermined threshold. The output signal of low voltage detection circuitry transitions to a logic high signal received at the input IN. Because signal IN transitions to a logic high and signal at node A is at a logic low, output of NAND gate 210 transitions to a logic low signal at node INDB. A logic low signal at node INDB coupled to reset inputs R of flip-flops 206 and 208 causes logic low signals provided at outputs Q of flip-flops 206 and 208. Logic low signals at nodes A and B in turn causes output of OR gate 212 to provide a logic low signal at output OUT.

In this embodiment, the logic low portion of signal IN corresponds to a low voltage detection characterized as a reset condition. The logic low portion of the signal is blocked from time t3 to time t4. After signal IN transitions to a logic high, the resulting logic low at the output OUT, alone or in combination with other signals, can provide indication that a reset condition has occurred. By blocking the reset condition from time t3 to time t4, testing can continue without interruption. Once voltage is restored to a level at or above the predetermined threshold, the blocked reset condition can be allowed to propagate as a delayed signal at the output OUT.

For example, the period from time t3 to time t4 may be used to determine a minimum operating voltage for digital circuitry. During this period, voltage applied at the VDD power supply terminal may be reduced such that a minimum operating voltage for digital circuitry may be determined. Once the minimum operating voltage has been determined, the voltage applied at VDD power supply terminal may be increased until the predetermined threshold is met or exceeded causing the output signal of low voltage detection circuitry to transition to a logic high signal, indicating that the voltage applied at VDD power supply terminal is sufficient to provide normal operation of digital circuitry. Because digital circuitry may have become non-functional during the minimum operating voltage determination, a reset of the digital circuitry is desirable once the voltage applied at VDD power supply terminal is sufficient for normal operation. Accordingly, a reset pulse signal may be generated at the output OUT to restore functional operation.

At time t5, the signal at node A transitions to a logic high. After signal IN transitions to a logic high, two clock cycles of clock signal CLK is used to propagate the logic high at input D of flip-flop 202 through output Q of flip-flop 204 at node A. In turn, the signals at the outputs of OR gate 212 and NAND gate 210 transition to a logic high at output OUT and node INDB respectively. The logic high signal at output OUT, alone or in combination with other signals, can provide indication that the reset condition is no longer active or occurring.

Generally, there is provided, a signal management circuit including: a first input terminal to receive a first signal; a first logic portion coupled to the first input terminal and configured to provide a first output signal; a second logic portion coupled to receive a second signal and configured to provide a second output signal, the second signal based on the first output signal and the first signal; and an output terminal coupled to provide a third output signal based on the first output signal and the second output signal. The circuit may further include: a second input terminal coupled to the second logic portion to receive an enable signal; when the enable signal is at a first state, the third output signal transitions to a first state responsive to receiving a first edge of first signal, and when the enable signal is at a second state, delaying the third output signal transition to a first state responsive to receiving a first edge until after receiving a second edge of the first signal. The enable signal may be characterized as a test signal corresponding to a test mode. The first signal may correspond to reset condition indication signal. The reset indication signal may correspond to a low voltage detection signal. The first logic portion may include a first flip-flop and a second flip-flop coupled in series, the first flip-flop and the second flip-flop each coupled to receive the first signal at a reset input. The second logic portion may include a third flip-flop and a fourth flip-flop coupled in series, the third flip-flop and the fourth flip-flop each coupled to receive the second signal at a reset input. The circuit may further include a first logic circuit having a first input coupled to receive the first output signal, a second input coupled to receive the first signal, and an output coupled to provide the second signal. The circuit may further include a second logic circuit having a first input coupled to receive the first output signal, a second input coupled to receive the second output signal, and an output coupled to the output terminal.

In another embodiment, there is provided, a signal management circuit including: a first input terminal to receive a reset condition indication signal; a second input terminal coupled to receive a test signal; and an output terminal coupled to provide an output signal; when the test signal is at a first state, the output signal transitions to a first state responsive to receiving a first edge of the reset condition indication signal, and when the test signal is at a second state, delaying the output signal transition to a first state responsive to receiving a first edge of the reset condition indication signal until after receiving a second edge of the reset condition indication signal. The circuit may further include: a first logic portion coupled to the first input terminal and configured to provide a first signal; and a second logic portion coupled to the second input terminal and configured to provide a second signal, the output signal based on the first signal and the second signal. The first logic portion may include a first flip-flop and a second flip-flop coupled in series, the first flip-flop and the second flip-flop each coupled to receive the reset condition indication signal at a reset input. The second logic portion may include a third flip-flop and a fourth flip-flop coupled in series, the third flip-flop and the fourth flip-flop each coupled to receive a third signal at a reset input, the third signal based on the first signal and the reset condition indication signal. The circuit may further include a first logic circuit having a first input coupled to receive the first signal, a second input coupled to receive the reset condition indication signal, and an output coupled to provide the third signal. The circuit may further include a second logic circuit having a first input coupled to receive the first signal, a second input coupled to receive the second signal, and an output coupled to provide the output signal at the output terminal. The test signal may be indicative of a test mode. The reset condition indication signal may correspond to a low voltage detection signal.

In yet another embodiment, there is provided, a method including: receiving an indication that a reset condition is active; during a first state of a test signal, performing a reset operation in response to receiving the indication that the reset condition is active, and during a second state of the test signal, delaying the reset operation in response to receiving the indication that reset condition is active until after receiving an indication that the reset condition is no longer active. The test signal may correspond to a test mode, the test mode inactive during the first state of the test signal and active during the second state of the test signal. The indication that a reset condition is active may be based on a low voltage detection signal.

By now it should be appreciated that there has been provided, an integrated circuit that includes reset management circuitry to selectively block or delay an indication of a reset condition during a test operation. For example, a margin test operation typically includes systematically reducing voltage supplied to digital circuitry under test until a failure is detected. The failure may likely occur at a voltage level lower than a predetermined threshold of voltage monitors designed to safeguard operation of such circuitry. A reset condition initiated by reducing the supplied voltage below the predetermined threshold can be safely blocked during the test operation, allowing the test operation to complete without interruption and delaying a reset of the digital circuitry until completion of the test operation.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name, an asterix (*) following the name, or the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A signal management circuit, comprising:
   a first input terminal to receive a first signal;
   a first logic portion coupled to the first input terminal and configured to provide a first output signal;
   a second logic portion coupled to receive a second signal and configured to provide a second output signal, the second signal based on the first output signal and the first signal;
   an output terminal coupled to provide a third output signal based on the first output signal and the second output signal;
   a second input terminal coupled to the second logic portion to receive an enable signal;
   when the enable signal is at a first state, the third output signal transitions to a first state responsive to receiving a first edge of the first signal, and
   when the enable signal is at a second state, delaying the third output signal transition to a first state responsive to receiving a first edge until after receiving a second edge of the first signal.

2. The circuit of claim 1, wherein the enable signal is characterized as a test signal corresponding to a test mode.

3. The circuit of claim 1, wherein the first signal corresponds to reset condition indication signal.

4. The circuit of claim 3, wherein the reset indication signal corresponds to a low voltage detection signal.

5. The circuit of claim 1, wherein the first logic portion includes a first flip-flop and a second flip-flop coupled in series, the first flip-flop and the second flip-flop each coupled to receive the first signal at a reset input.

6. The circuit of claim 5, wherein the second logic portion includes a third flip-flop and a fourth flip-flop coupled in series, the third flip-flop and the fourth flip-flop each coupled to receive the second signal at a reset input.

7. The circuit of claim 1, further comprising a first logic circuit having a first input coupled to receive the first output signal, a second input coupled to receive the first signal, and an output coupled to provide the second signal.

8. The circuit of claim 7, further comprising a second logic circuit having a first input coupled to receive the first output signal, a second input coupled to receive the second output signal, and an output coupled to the output terminal.

9. A signal management circuit, comprising:
   a first input terminal to receive a reset condition indication signal;
   a second input terminal coupled to receive a test signal; and
   an output terminal coupled to provide an output signal;
   when the test signal is at a first state, the output signal transitions to a first state responsive to receiving a first edge of the reset condition indication signal, and
   when the test signal is at a second state, delaying the output signal transition to a first state responsive to receiving a first edge of the reset condition indication signal until after receiving a second edge of the reset condition indication signal.

10. The circuit of claim 9, further comprising:
    a first logic portion coupled to the first input terminal and configured to provide a first signal; and
    a second logic portion coupled to the second input terminal and configured to provide a second signal, the output signal based on the first signal and the second signal.

11. The circuit of claim 10, wherein the first logic portion includes a first flip-flop and a second flip-flop coupled in series, the first flip-flop and the second flip-flop each coupled to receive the reset condition indication signal at a reset input.

12. The circuit of claim 11, wherein the second logic portion includes a third flip-flop and a fourth flip-flop coupled in series, the third flip-flop and the fourth flip-flop each coupled to receive a third signal at a reset input, the third signal based on the first signal and the reset condition indication signal.

13. The circuit of claim 12, further comprising a first logic circuit having a first input coupled to receive the first signal, a second input coupled to receive the reset condition indication signal, and an output coupled to provide the third signal.

14. The circuit of claim 13, further comprising a second logic circuit having a first input coupled to receive the first signal, a second input coupled to receive the second signal, and an output coupled to provide the output signal at the output terminal.

15. The circuit of claim 9, wherein the test signal is indicative of a test mode.

16. The circuit of claim 9, wherein the reset condition indication signal corresponds to a low voltage detection signal.

17. A method comprising:
    receiving an indication that a reset condition is active;
    during a first state of a test signal, performing a reset operation in response to receiving the indication that the reset condition is active; and
    during a second state of the test signal, delaying the reset operation in response to receiving the indication that reset condition is active until after receiving an indication that the reset condition is no longer active.

18. The method of claim 17, wherein the test signal corresponds to a test mode, the test mode inactive during the first state of the test signal and active during the second state of the test signal.

19. The method of claim 17, wherein the indication that a reset condition is active is based on a low voltage detection signal.

* * * * *